(12) United States Patent
Sharma et al.

(10) Patent No.: US 7,016,422 B2
(45) Date of Patent: Mar. 21, 2006

(54) PRIORITY DELAY INSERTION CIRCUIT

(75) Inventors: Harsh D. Sharma, Austin, TX (US);
Nayon Tomsio, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 747 days.

(21) Appl. No.: 09/925,993

(22) Filed: Aug. 9, 2001

(65) Prior Publication Data

US 2003/0031194 A1   Feb. 13, 2003

(51) Int. Cl.
*H04B 3/00* (2006.01)
(52) U.S. Cl. ............................ 375/257; 375/295; 716/6
(58) Field of Classification Search ................ 375/257, 375/295; 716/5, 6
See application file for complete search history.

(56) References Cited

U.S. PATENT DOCUMENTS

| 5,313,501 | A | 5/1994 | Thacker |
| 6,532,574 | B1 * | 3/2003 | Durham et al. ................. 716/6 |
| 2002/0124230 | A1 * | 9/2002 | Cai et al. ........................ 716/6 |
| 2003/0072332 | A1 | 4/2003 | Tomsio et al. |
| 2003/0120982 | A1 | 6/2003 | Levy et al. |

* cited by examiner

*Primary Examiner*—Jay K. Patel
*Assistant Examiner*—David B. Lugo
(74) *Attorney, Agent, or Firm*—Zagorin O'Brien Graham LLP

(57) ABSTRACT

A method of transmitting and prioritizing signals is disclosed. Higher priority signals are switched while lower priority signals are delayed until the higher priority signals have completed switching. The method is used in networks where coupling and capacitance effects are possible.

24 Claims, 7 Drawing Sheets

PRIORITY DELAY INSERTION CIRCUIT

BACKGROUND OF THE INVENTION

1. Field of the Invention

This invention relates to a method and system using delay signals to reduce or eliminate interference between paths in a communication network, in particular to an electronic circuit.

2. Description of the Related Art

Communication networks, in particular communication networks on integrated circuits, have numerous paths carrying signals from one device to other devices. Multiple paths that are placed near one another can lead to problems related to coupling and capacitative interference. The situation becomes more problematic when multiple paths carrying signals switching in the same direction run parallel to a single path switching in the opposite direction.

In cases of multiple paths carrying signals that switch opposite of a single path, the multiple paths are referred to as aggressors and the single path is referred to as a victim. Coupling effects do not have a noticeable effect upon aggressor signals with one another, because the signals of the aggressors are switching in the same direction. In a digital signal transmission, the rise of the signal from a driver connected to an aggressor path is not affected by signals from the other aggressor paths. Coupling effects, however, can have an effect upon the victim path's signal. In particular coupling effects lead to slower rise times of victim path signals. To compensate for slower rise times, victim path driver power is increased. The victim path driver is required to provide additional power to compensate for a slower rise time in order to get the signal out and to achieve proper signal level and timing requirements.

To alleviate the effects on victim paths by aggressor paths, the paths can be laid out to allow paths that carry signals that switch in the same direction to be placed near one another. This approach, however, leads to design constraints that require paths to be placed in limited positions and limit network architecture. In most situations, paths have opposing signals placed next to each other (e.g., send and receive signals to and from devices).

In certain designs, neutral paths such as ground paths (also known as shield lines) are available and placed between aggressors and victim paths, effectively shielding the victim path. Shield lines typically serve no function but are merely used to shield the victim path. The use of neutral paths or shield lines also leads to design considerations and network architecture constraints in laying out paths. Adding shield lines further adds to an increase in the space of the network. In an integrated circuit, minimizing size is highly desirable, and adding non-functional shield lines becomes counter productive to meeting the goal of minimizing size.

SUMMARY OF THE INVENTION

In one embodiment, a method of transmitting a signal is disclosed. The method includes assigning priorities to transmitted signals. Signals that have a lower priority compared to signals with a higher priority are delayed until the higher priority signals are switched. In certain embodiments, a delay pulse is sent to by the higher priority signal or signals to the lower priority signal or signals.

In another embodiment, a signal driver is disclosed. The signal driver includes a delay signal that is sent to lower priority signals that are adjacent to and can interfere with the signal generated by the signal driver. The delay signals prevents the lower priority signals from switching while the signal driver switches the signal.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and it's numerous objects, features and advantages made apparent to those skilled in the art by referencing the accompanying drawings. The use of the same reference number throughout the figures designates a like or similar element.

Figure 1:
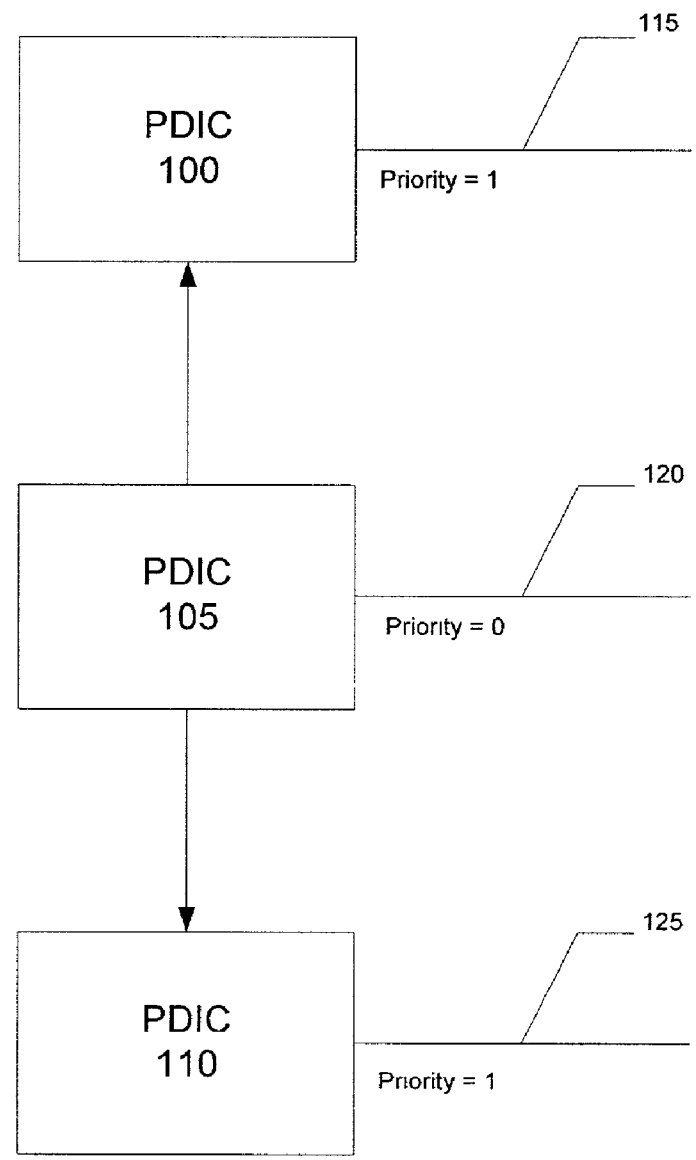
FIG. 1 is a block diagram illustrating a network with priority delay insertion circuits.

While the invention is susceptible to various modifications and alternative forms, specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the scope of the present invention as defined by the appended claims.

DETAILED DESCRIPTION

Digital signals rise from a zero value to a set value that correlates to a digital value of "1." There is a slight rise time and an associated rising edge, as well as a slight fall time and a falling edge associated with the transmitted signal. When a signal is transitioning during a rise or fall time, the signal is said to be switching.

This invention provides for a delay between signals, specifically signals that are close to one another that are switching in opposite direction. While a signal is switching, an adjacent signal is delayed while the transmitting signal completes switching. To determine which signal is delayed, signals are given priorities as to which signal is allowed to switch and which signal is delayed. The delay places the signals out of phase with one another, to allow signals to be transmitted with minimal coupling and capacitance effects from opposite switching signals. Reducing or eliminating the coupling and capacitance effects allows signal paths to be placed closer to one another.

FIG. 1 is a block diagram illustrating a network with priority delay insertion circuits. In embodiments of the invention, the signal drivers incorporate a priority delay. Such signal drivers in embodiments of this invention are referred to as priority delay insertion circuits (PDIC). PDICs can be part of a network and can be designed as a part of a larger integrated circuit. This particular example shows a network that includes PDIC 100, PDIC 105, and PDIC 110. PDICs 100, 105 and 110 have specific priority values. PDIC 105 has a signal 120, signal 120 having a priority value of 0. A priority value of 0 takes precedence over all other priority values (e.g., binary values of 1, 10, 11, etc.). PDIC 100 has a signal 115 and signal 115 has a priority value 1. Likewise PDIC 110 has signal 125 and signal 125 has a priority value of 1. Whenever PDIC 105 switches a signal (i.e., transition in the rising or falling edge of signal transmission), that signal takes precedence over signals that are transmitted by PDIC 100 and PDIC 110. PDIC 100 and 110 respectively have priority value of 1.

Figure 2:
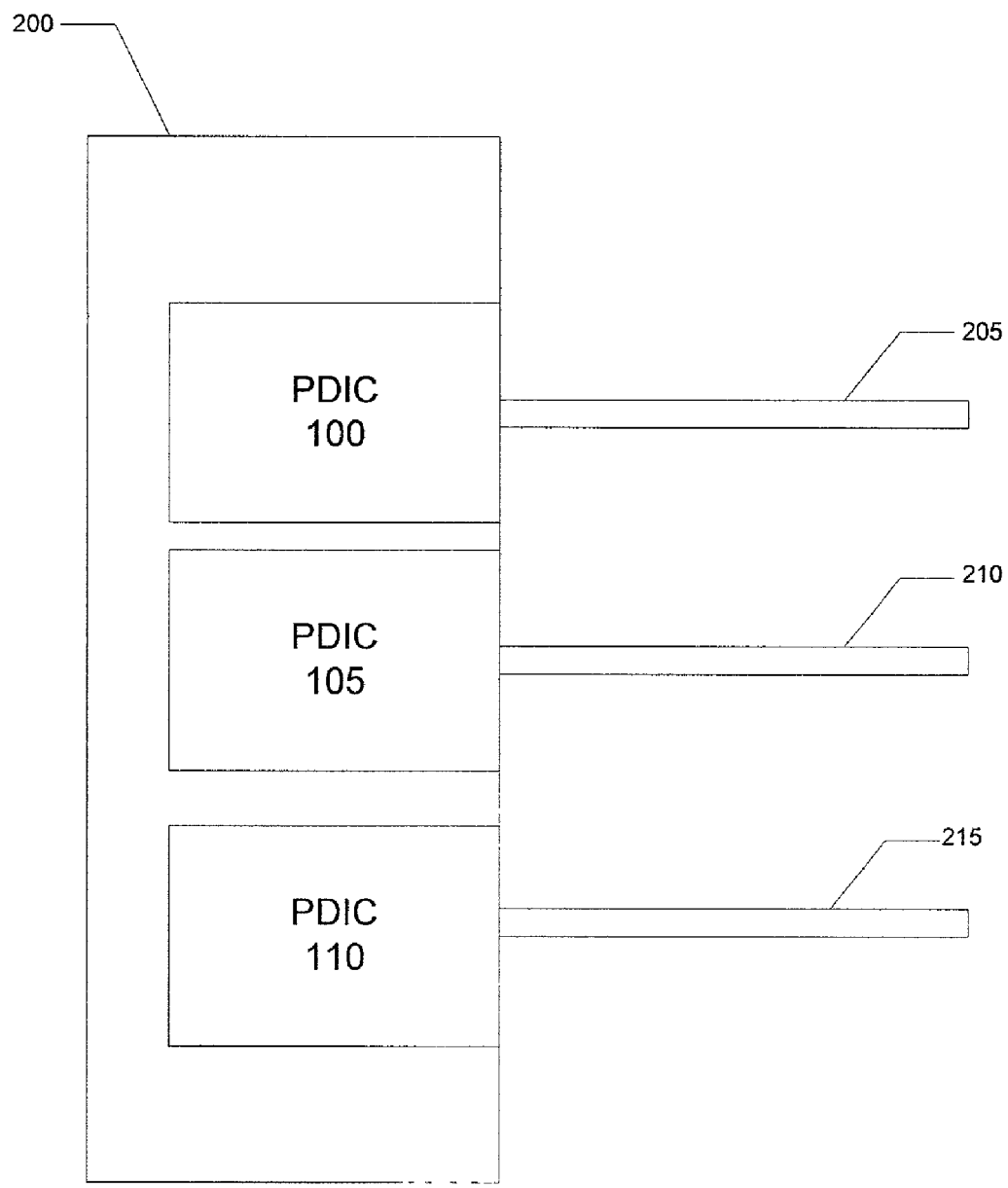
FIG. 2 is a block diagram illustrating a network layout with using priority delay insertion circuits and wires.

FIG. 2 is a block diagram illustrating a network layout with PDICs and wires. A cell 200 contains PDICs 100, 105, and 110. In certain applications, cell 200 can be part of a larger integrated circuit or system. Cell 200 is considered a subsystem that includes PDICs 100, 105, and 110 interconnected to one another, and setting priority as to signal transmission. PDICs 100, 105, 110 act as drivers to transmit signals. PDIC 100 transmits signals along a path 205. PDIC 105 transmits signals along a path 210. PDIC 110 transmits signals along a path 215. Signal paths that are relatively longer in length can require priority over all other paths. For example path 210 can be a longer path, therefore path 210 is given the highest priority of 0. Path 210 can also be a victim path to paths 205 and 215, therefore path 210 is given priority of 0. Priority delay logic within PDICs 100, 105, and 110 allow paths 205, 210, and 215 to be placed relatively close to one another and avoid coupling effects in signal transmission. Allowing the signals to be placed closer to one another provides for a denser architecture and smaller sized circuits.

Figure 3:
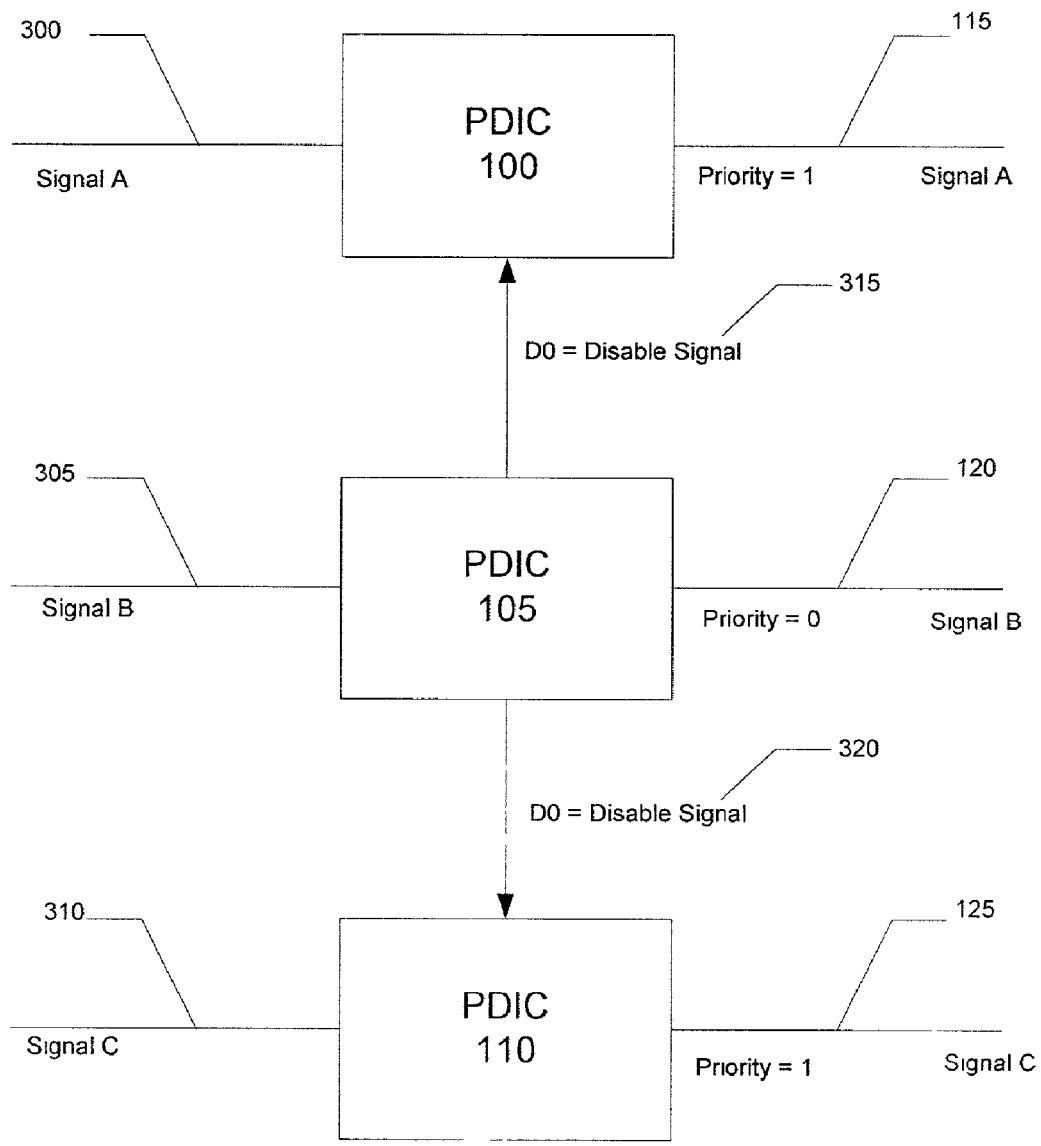
FIG. 3 is a block diagram illustrating a network architecture incorporating disable logic signals.

FIG. 3 is a block diagram illustrating a network architecture incorporating disable logic signals. This embodiment of the invention provides for PDICs 100, 105, and 110 to act as drivers driving particular signals. PDIC 100 drives a signal A 300. PDIC 105 drives a signal B 305. PDIC 110 drives a signal C 310. PDIC 105 and signal B 305 have priority of 0. Whenever signal B 305 is switched, PDIC 105 provides a disable signal D0 315 to PDIC 100, and a disable signal D0 320 to PDIC 110. Delaying switching of signal A 300 and signal C 310, allows signal C 305 to be transmitted without interference. Once signal C 305 is switched, delay signal D0 315 and delay signal D0 320 are disabled. Hardware, firmware, and/or software logic can provide delay signals. For example, a shot flip-flop device can provide a hardware delay sufficient for switching to occur. Since rise and fall times are known and/or can be accurately estimated, the necessary time delay can be provided that accounts for the rise and fall times.

Figure 4:
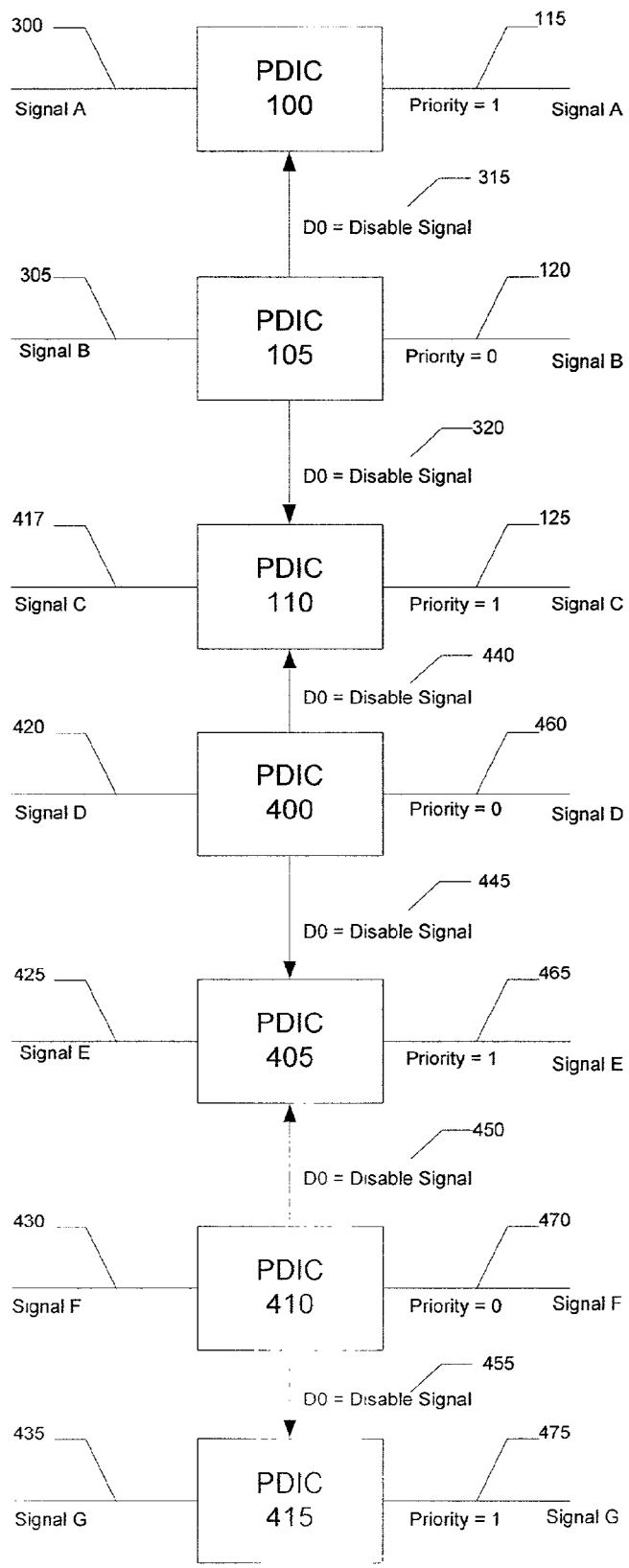
FIG. 4 is a block diagram illustrating multiple priority delay insertion circuits.

FIG. 4 is a block diagram illustrating multiple PDICs. Several PDICs can be connected to one another in the same cell. Priority logic connects the PDICs and contention is set among PDICs that are adjacent to one another. This particular system includes PDIC 100, PDIC 105, PDIC 110, PDIC 400, PDIC 405, PDIC 410 and PDIC 415. PDIC 100 drives signal A 300. PDIC 105 drives signal B 305. PDIC 110 drives signal C 417. PDIC 400 drives signal D 420. PDIC 405 drives signal E 425. PDIC 410 drives signal F 430. PDIC 415 drives signal G 435. In this example, the PDICs are placed in a manner such that PDICs and signals with priority value 0 are placed between PDICs and signals with priority value 1. Signals B 120, D 460, and F 470 have values of 0. Signals S 115, C 125, E 465, and G 475 have values of 1. Whenever signals B 305, D 420 and F 430 are switching (i.e., on the rising or falling edge), signals A 300, C 417, E 425, and G 435 are temporarily disabled. In this example, disabling of signals is limited to signals that are adjacent to one another. PDIC 105 can disable PDIC 100 and PDIC 110, but is not able nor is it necessary (i.e., necessary to avoid coupling interference) to disable PDIC 405 or any PDTC that is not directly adjacent to PDIC 105. A PDIC with a lower priority value of 1, such as PDIC 110 can be disabled by adjacent PDICs having a priority value of 0, in particular PDIC 105 and PDIC 400. PDIC 400 can send disable signal 440 to PDIC 110 and PDIC 105 can send disable signal 320 to PDIC 110. PDIC 400 can also disable PDIC 405 with a disable signal 445. PDIC 405 can also be disabled by PDIC 410 by a disable signal 450. PDIC 410 through disable signal 455 is able to disable PDIC 415.

Figure 5:
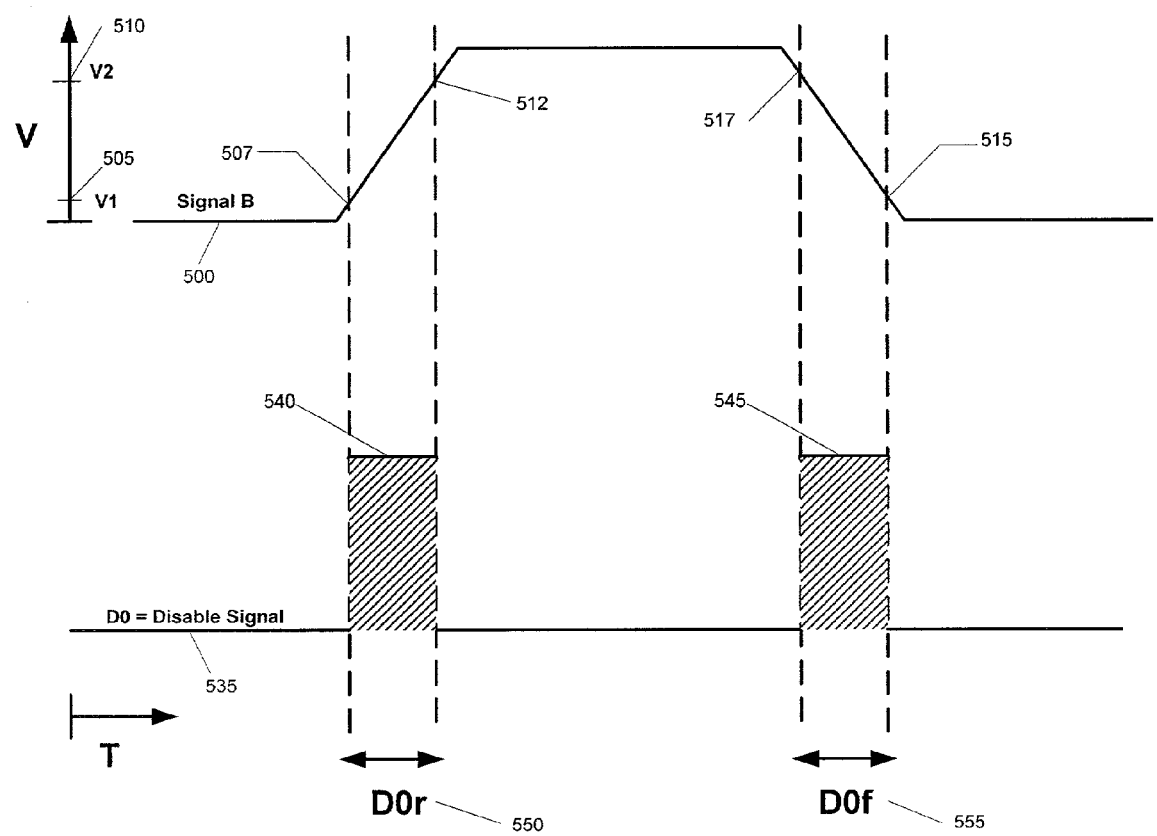
FIG. 5 is a timing diagram illustrating a priority 0 signal that disables a priority 1 signal.

FIG. 5 is a timing diagram illustrating a priority 0 signal that disables a priority 1 signal. Signal B 500 is a priority 0 signal. In a digital signal such as signal B 500, relative minimum voltage values exist that relate to a "0" value (i.e., off value), or a "1" value (i.e., on value). In this example the relative minimum voltage values are V1 505 that relates to a "0" value and V2 510 that relates to a "1" value. When signal B 500 falls below V1 505, the signal is considered to have a value of "0" (i.e., the signal is off). When signal B 500 reaches or exceeds V2 510, the signal is considered to have a value of "1" (i.e, the signal is on). If coupling effects and capacitance effects are present, a greater requirement is placed on a driver to get signal B 500 to reach V2 510.

The rising edge of signal B 500 begins at time-voltage value 507. The rising edge ends at time-voltage value 512. The falling edge of signal B 500 begins at time-voltage value 517, and the falling ends at time-voltage value 515. A disable signal 535 is activated whenever signal B is switching on the rising or falling edge. Between time-voltage values 507 and 512, a disable pulse 540 is transmitted. The time of transmission of disable pulse 540 is represented by the time period D0r 550. Between time-voltage values 517 and 515, a disable pulse 545 is transmitted. The time of transmission of disable pulse 545 is represented by the time period D0f 555. Disable pulses 540 and 545 are received by adjacent PDICs that are transmitting lower priority signals. The lower priority signals are then delayed during the time disable pulses 540 and 545 are transmitted.

Figure 6:
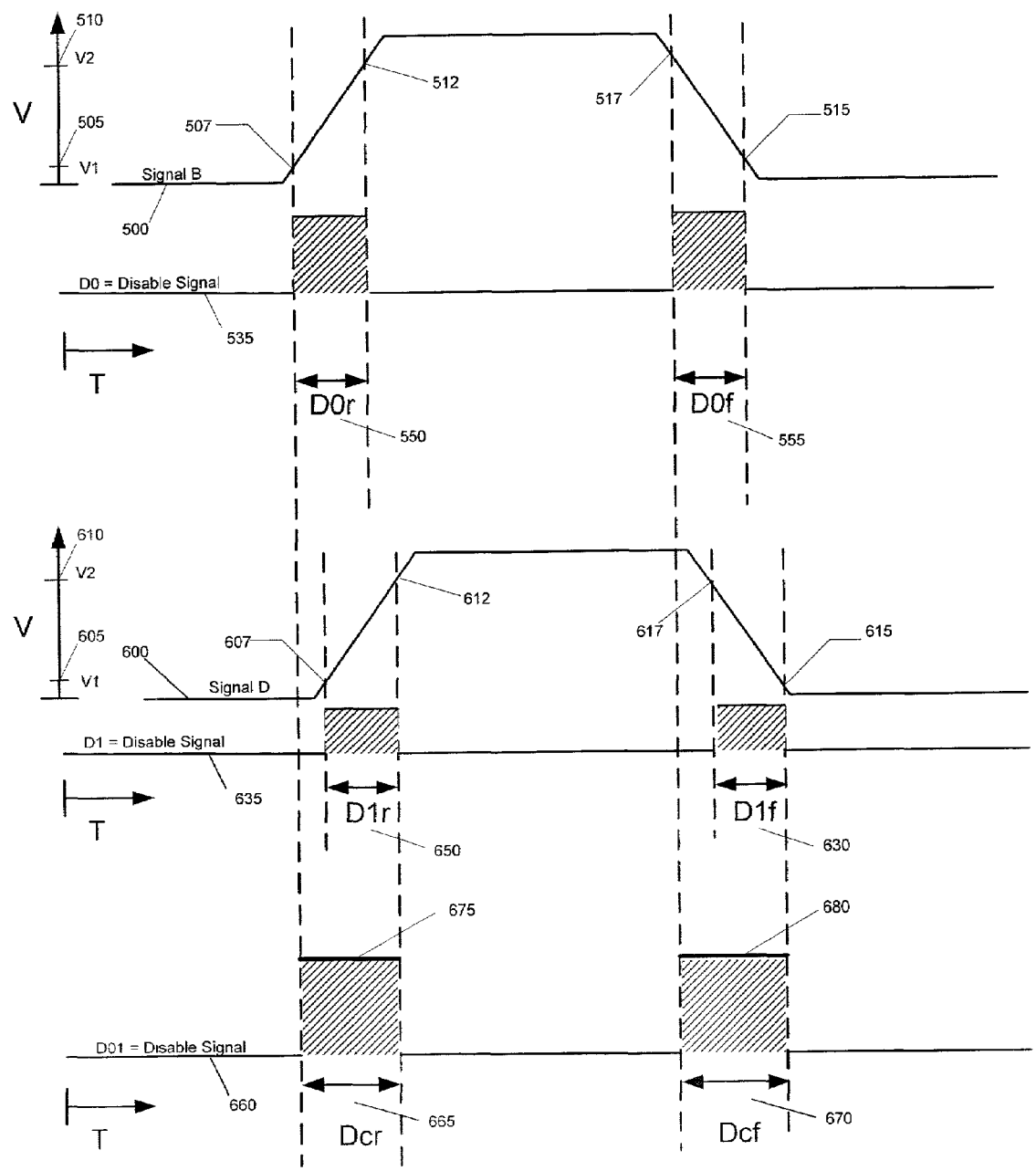
FIG. 6 is a timing diagram illustrating multiple priority 0 signals and disabling a priority 1 signal.

FIG. 6 is a timing diagram illustrating multiple priority 0 signals and disabling a priority 1 signal. When two priority 0 signals switch at or near the same time, a disable signal is provided to a common PDIC that is adjacent to the priority 0 signals. In this example, signals B 500 and D 600 are a priority 0 signals, and a disable pulse is sent to common adjacent priority 1 PDIC C 110. Signal D 600 is a signal with relative threshold values V1 605 and V2 610. Signal D 600 has a rising edge that begins at time-voltage value 607 and ends at time-voltage value 612. Signal D 600 has a falling edge that begins at time-voltage value 617 and ends at time-voltage value 615. The rising edge of signal D 600 is represented by the time period D1r 650. The falling edge of signal D 600 is represented by time period D1f 630. Time period D0r 550 has some overlap with time period D1r 650. D0r 550 begins and ends before D1r 650. D0f 555 and D1f 630 also overlap in this example. D0f 555 in this particular case begins and ends before D1f 630. In other cases the time periods may or may not overlap. Overlap depends when the signals are transmitted. Disable signal D01 660 is activated and sent to PDIC 100 during the overlap of rising and falling edges of signal B 500 and signal D 600. An activated disable signal D01 660 is represented by a disable pulse 675 and a disable pulse 680. Time period Dcr 665 represents the time period overlap of the rising edges of signal B 500 and signal D 600. Time period Dcf 670 represents the time period overlap of the falling edges of signal B 500 and signal D 600. PDIC 100 is disabled from transmitting during the time periods Dcr 665 and Dcf 670.

Figure 7:
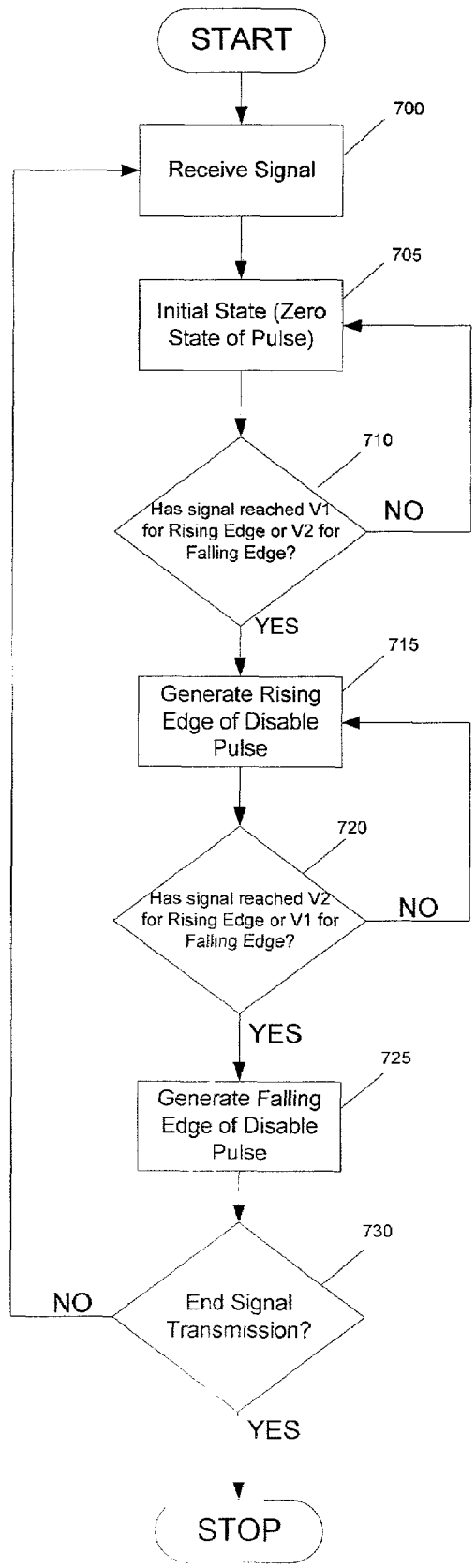
FIG. 7 is a flow chart illustrating when a disable pulse is generated.

FIG. 7 is a flow chart illustrating when a disable pulse is generated. A disable pulse is activated based on the condition of a signal having priority value of 0. The disable pulse is generated while the signal having a priority value of 0 switches. Signals having a priority value of 1 that are adjacent or can interfere with the signal having a priority value of 0 are prevented from switching by the disable pulse. The priority value 0 signal begins transmission or is being sent and received, step 700. A threshold value, V1 must be reached by priority value 0 signal. V1 in this case can be either a relative minimum or a maximum value. A relative minimum value represents a digital 0 value and a relative maximum value of 1. Switching by the priority 0 signal is made either during the rising edge or the falling edge of transmission. The disable pulse remains at a zero initial state prior to the signal reaching V1, step 705. A determination is made as to whether the signal has reached V1, step 710. When the disable pulse reaches V1, the disable pulse is generated, in specific the rising edge of the disable pulse is started, step 715. When the priority value 0 signal reaches a voltage value of V2, switching of the priority value 0 signal is considered complete. V2 can be either a relative minimum or a maximum value; however, V2 will be a relative minimum if V1 is a relative maximum or V2 will be a relative maximum if V1 is a relative minimum. When V2 is reached, switching is complete, a determination is made as to whether V2 has been reached, step 720. Once V2 is reached the disable pulse is turned off. Turning off the disable pulse is represented by generating a falling edge of the disable pulse, step 725. The process continues until transmission of the priority value signal is complete, step 730.

Although the present invention has been described in connection with several embodiments, the invention is not intended to be limited to the specific forms set forth herein, but on the contrary, it is intended to cover such alternatives, modifications, and equivalents as can be reasonably included within the scope of the invention as defined by the appended claims.

What is claimed is:

1. A method comprising:
   detecting a transition of a first signal associated with a first signal path; and
   dynamically inserting a delay in a second signal path associated with a second signal based on at least the detection of the transition, a priority value of the first signal path, and a priority value of the second signal path;
   generating a first delay pulse based on the transition of the first signal;
   communicating the first delay pulse from a first circuit associated with the first signal path to a second circuit associated with the second signal path;
   detecting a second transition of a third signal associated with a third signal path;
   generating a second delay pulse based on the second transition;
   communicating the second delay pulse from a third circuit associated with the third signal path to the second circuit; and
   wherein the period of the delay is based on at least the first delay pulse, the second delay pulse, and the dynamic delaying is based on the detection of the second transition and a priority value of the third signal path.

2. The method of claim 1 wherein the period of the delay is based on at least a duration of the transition period of the first signal.

3. The method of claim 1 wherein the delay period is based on non-overlapping portions of the first delay pulse and the second delay pulse.

4. The method of claim 1 wherein the priority value of the first signal path and the priority value of the third signal path are equal.

5. The method of claim 1 wherein the priority values of the first and second signal paths are based on effects of coupling between the first signal path and the second signal path.

6. The method of claim 1 wherein the priority values of the first and second signal paths are based on corresponding signal path lengths.

7. The method of claim 1 wherein the first and second signal paths are adjacent signal paths.

8. The method of claim 1 wherein the dynamic insertion of the delay inhibits a transition from occurring on the second signal path simultaneously with the transition on the first signal path.

9. An apparatus comprising:
   a first signal driver associated with a first priority value and being coupled to a first signal path;
   a second signal driver associated with a second priority value and being coupled to a second signal path; and
   wherein the first signal driver provides a disable signal to the second signal driver based on at least the first priority value, the second priority value, and a detected transition of a first signal associated with the first signal path.

10. The apparatus of claim 9 wherein the first signal driver communicates to the second signal driver a first delay pulse based on the detected transition.

11. The apparatus of claim 9, wherein the disable signal delays the second signal for a period based on at least a duration of the transition period of the first signal.

12. The apparatus of claim 9, further comprising
   a third signal driver associated with a third priority value and being coupled to a third signal path; and
   wherein the third signal driver provides a second disable signal to the second signal driver based on at least the third priority value, the second priority value, and a detected transition of a third signal associated with the third signal path.

13. The apparatus of claim 12, wherein the second signal is delayed by a period based on at least a duration of the transition period of the first signal and a duration of the transition period of the third signal.

14. The apparatus of claim 12, wherein the first and second disable signals are first and second delay pulses and the second signal is delayed by a period based on non-overlapping portions of the first and second delay pulses.

15. The apparatus of claim 12 wherein the priority value of the first signal path and the priority value of the third signal path are equal.

16. The apparatus of claim 9, further comprising:
   a fourth signal driver associated with a fourth priority value and being coupled to a fourth signal path; and
   wherein the first signal driver provides the disable signal to the fourth signal driver based on at least the first priority value, the fourth priority value, and a detected transition of the first signal associated with the first signal path.

17. The apparatus of claim 9 wherein the first and second priority values are based on effects of coupling between the first signal path and the second signal path.

18. The apparatus of claim 9 wherein the first and second priority values are based on corresponding signal path lengths.

19. The apparatus of claim 9 wherein transitions on the first signal path based on the disable signal occur out of phase with transitions on the second signal path.

20. An apparatus comprising:
   means for detecting a transition of a first signal associated with a first signal path; and
   means for disabling a second signal associating with a second signal path, the disabling being based on at least a disabling signal receive from the means for detecting, the disable signal being provided based on at least the detection of the transition, a priority value of the first signal path, and a priority value of the second signal path.

21. The apparatus of claim 20 wherein the first and second priority values are based on effects of coupling between the first signal path and the second signal path.

22. The apparatus of claim 20 wherein the disabling inhibits a transition on the second signal path from occurring simultaneously with the transition on the first signal path.

23. A method comprising:
   detecting a transition of a first signal associated with a first signal path and associated with a first priority value, the detecting being by at least a first signal driver; and
   disabling a second signal associated with a second signal path and associated with a second priority value, the disabling being based on at least a disable signal provided by the first signal driver to a second signal driver and the disable signal being provided based on at least the first priority value, the second priority value, and the detected transition.

24. The method of claim 23 wherein the second signal is disabled for a period based on at least a duration of the transition period of the first signal.

* * * * *

UNITED STATES PATENT AND TRADEMARK OFFICE
CERTIFICATE OF CORRECTION

PATENT NO. : 7,016,422 B2  
APPLICATION NO. : 09/925993  
DATED : March 21, 2006  
INVENTOR(S) : Harsh D. Sharma and Nayon Tomsio It is certified that error appears in the above-identified patent and that said Letters Patent is hereby corrected as shown below:

In column 2, line 54, replace "direction" with --directions--;

In column 4, line 8, replace "PDTC" with --PDIC--;

In column 6, line 41, replace "comprising" with --comprising:--;

In column 7, line 13, replace "associating" with --associated--;
        line 15, replace "disabling signal receive" with --disable signal received--.

Signed and Sealed this

First Day of August, 2006

JON W. DUDAS  
*Director of the United States Patent and Trademark Office*